United States Patent
Gurewitz et al.

[11] Patent Number: 5,881,947
[45] Date of Patent: Mar. 16, 1999

[54] METHOD FOR SOLDERING

[75] Inventors: Avionoam Gurewitz, Ramat-Hasharen; Rudolf Perlman, Givat Schmuel; Avi Rochman, Nirit, all of Israel

[73] Assignee: Motorola, Inc., Schaumburg, Ill.

[21] Appl. No.: 692,899

[22] Filed: Jul. 26, 1996

[30] Foreign Application Priority Data

Jul. 29, 1995 [GB] United Kingdom .................... 9515714

[51] Int. Cl.$^6$ .................................................. B23K 31/02
[52] U.S. Cl. ...................... 228/180.21; 228/203; 228/211
[58] Field of Search ............................ 228/180.21, 203, 228/211

[56] References Cited

U.S. PATENT DOCUMENTS

| | | | |
|---|---|---|---|
| 4,515,304 | 5/1985 | Berger | 228/180.21 |
| 4,789,096 | 12/1988 | Dunn et al. | 228/180.21 |
| 5,152,451 | 10/1992 | Darveaux et al. | 228/180.21 |
| 5,373,984 | 12/1994 | Wentworth | 228/180.21 |

FOREIGN PATENT DOCUMENTS 64-17495  1/1989  Japan ................................ 228/180.21

Primary Examiner—Patrick Ryan
Assistant Examiner—Jeffrey T. Knapp
Attorney, Agent, or Firm—M. Mansour Ghomeshi

[57] ABSTRACT

A method for soldering components to opposite sides of a receptive element includes the steps of applying a solder formulation to both sides of the receptive element (201) and placing components on a first side of the receptive element (204). The solder formulation is hardened on the first side of the receptive element (205). Components are placed on a second side of the receptive element and the solder formulation on the second side of the receptive element is hardened. The components are fixed to the receptive element by performing a single reflow operation (208).

12 Claims, 7 Drawing Sheets

METHOD FOR SOLDERING

FIELD OF THE INVENTION

This invention relates to the soldering of components. The invention is applicable to, but not limited to, the cladding of solder formulations and the soldering of components to printed circuit boards for use in component assembly processes.

BACKGROUND OF THE INVENTION

The conventional approach to assembling components on both sides of a double sided printed circuit board (PCB), using a reflow soldering process, consists of applying solder paste screen on one side of the PCB, placement of the components on the solder paste and soldering of the components in the reflow oven. This process is repeated on the second side of the PCB. The solder paste screen printing (cladding) is the most difficult and critical stage with regard to the reliability of the soldering process. Some techniques, that are in use to avoid this cladding stage, provide flat solid solder deposit and are carried out by the printed circuit board manufacturer. The process at an assembly plant consists of flux dispensing on the cladded pads, placement of the components on the flux, soldering of the components in the reflow oven, followed by a repetition of all the above process stages on the second side of the PCB. During the first reflow the cladding of the second side of the PCB changes its flat shape to a meniscus form, thus resulting in slippage of the components from the pads and faulty soldering of components.

Thus, there exists a need for an improved soldering process that prevents a meniscus formation of the solder paste during reflow operations, in particular with regard to the cladding of double sided PCBs.

SUMMARY OF THE INVENTION

According to the present invention, a method for soldering components to opposite sides of a receptive element is provided. The method comprises the steps of applying a solder formulation to both sides of the receptive element and placing components on a first side of the receptive element. The solder formulation on the first side of the receptive element is hardened and the receptive element inverted. Components are placed on a second side of the receptive element; and the solder formulation on the second side of the receptive element is hardened. Preferably the receptive element is placed in a reflow oven and a single reflow process is performed.

In this manner, components are soldered onto both sides of a receptive element, e.g. a printed circuit board, and advantageously only a single reflow operation is required.

In a preferred arrangement, the step of applying a solder formulation to both sides of the receptive element includes hardening the solder formulation on both sides of the receptive element followed by softening the solder formulation on the first side of the receptive element. Preferably the step of placing components on the second side of the receptive element is preceded by softening the solder formulation on a second side of the receptive element.

In this manner, the solder formulation on the receptive element is fixed at a sufficient level to avoid a meniscus of solder formulation forming during the process of softening the opposite side of the receptive element.

Preferably, the step of applying a solder formulation to both sides of the receptive element includes applying a fluxing composition to both sides of the receptive element wherein the step includes drying the receptive element at a temperature below an activation temperature of the fluxing composition. The fluxing composition may release a reducing agent upon exposure to ultraviolet light or comprise an ultraviolet sensitizer. In such a case, softening of the solder formulation is performed by transmitting ultraviolet light onto the receptive element. In an alternative arrangement, the application of a solvent or by any other method is used to soften the to the solder formulation on the receptive element.

A preferred embodiment of the invention will now be described, by way of example only, with reference to the drawings.

DETAILED DESCRIPTION OF THE DRAWINGS

Figure 1:
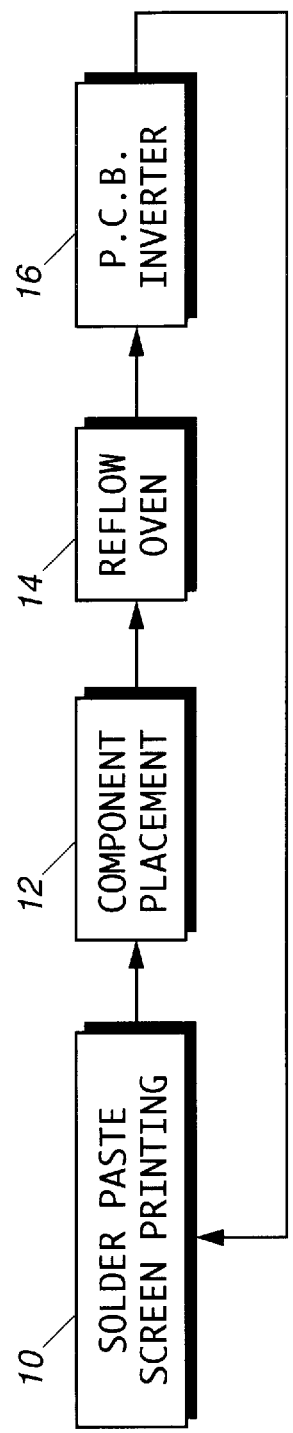
FIG. 1 is a flow chart showing a prior art assembly stage for a conventional double sided reflow soldering process.

Referring first to FIG. 1, a flow chart of the prior art assembly stage of a conventional double sided reflow soldering process is shown. The process consists of solder paste screen printing, as shown in step 10, on one side of a receptive element, e.g. a printed circuit board (PCB), followed by placement of components, as shown in step 12. Components are then fixed to the PCB in a reflow oven, as shown in step 14. The PCB is then inverted, as shown in step 16 and the process repeated from step 10 to step 16, as described above.

Figure 2:
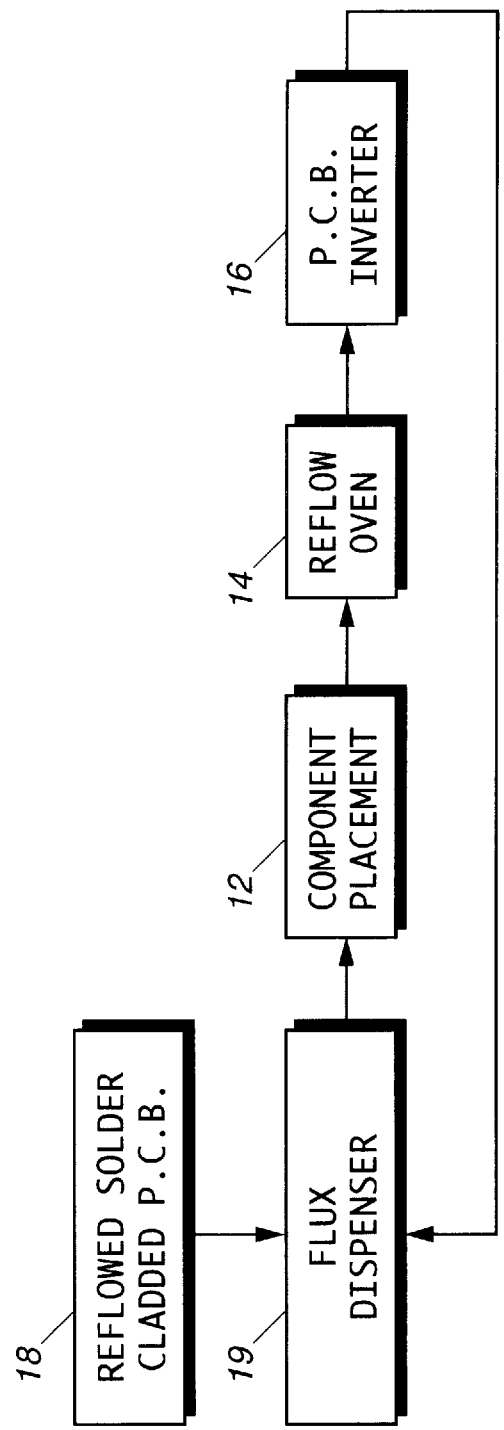
FIG. 2 is a flow chart showing a prior art reflow soldering process for cladded printed circuit boards (PCBs).

Referring now to FIG. 2, a flow chart of the prior art of a reflow soldering process of a cladded PCBs is shown. A reflowed solder cladded double sided PCB is used, as shown in step 18. Flux is dispensed on cladded pads on a first side of the PCB, as shown in step 19, followed by placement of the components, as in step 12. The components are then soldered in a reflow oven, as shown in step 14, followed by inverting the PCB, as shown in step 16 and repeating the process from step 10 to step 16 on a second side of the PCB.

Figure 3:
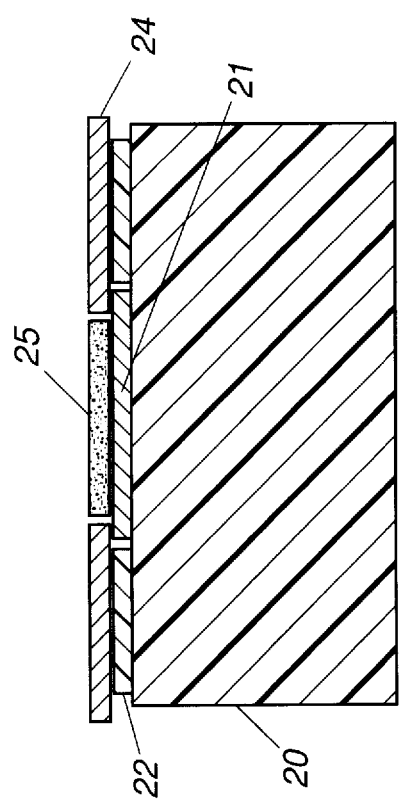
FIG. 3 shows a prior art cladded PCB structure before a conventional reflow process.

Referring now to FIG. 3, a prior art cladded PCB structure, prior to any reflow process, is shown. The cladded PCB structure includes a PCB 20, a solder mask 22, a copper pad 21 and stencils 24 enveloping a solder paste 25.

Figure 4:
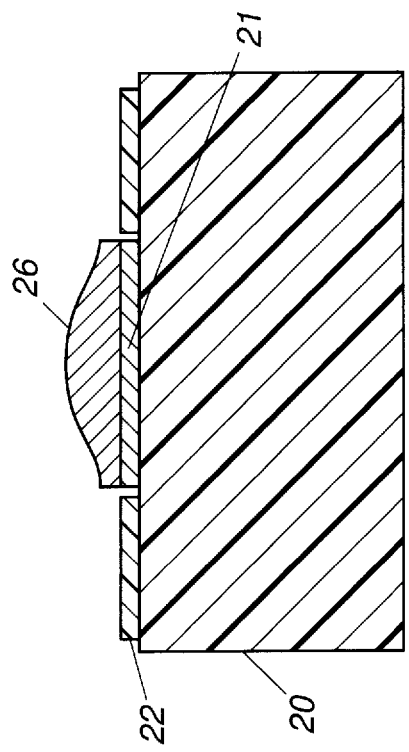
FIG. 4 shows a prior art cladded PCB structure after a conventional reflow process.

FIG. 4 shows the prior art cladded PCB structure of FIG. 3 after a reflow process. The reflow process causes the solder paste 25 to form a meniscus shape. This phenomenon is known as "meniscus of solid solder deposit (SSD)" 26 and causes problems when attempting to fix components with the solder paste, in particular prior to the fixing of components to the opposite side of a double sided PCB.

Figure 5:
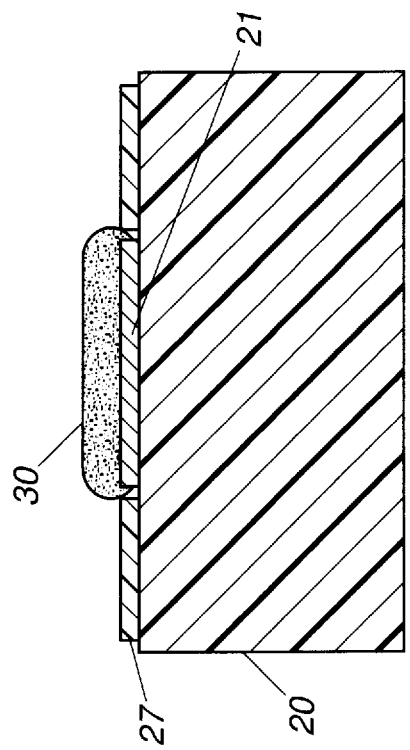
FIG. 5 shows a prior art Optipad™ (Registered Trade Mark of SMW Electronic, Germany) cladded P.C.B. structure before a cladding process.

Referring now to FIG. 5, an alternative prior art cladded PCB structure, an Optipad™ structure, prior to a cladding process, is shown. The Optipad™ structure includes a PCB 20, permanent solder mask 27, a copper pad 21 and a temporary solder mask 28.

Figure 6:
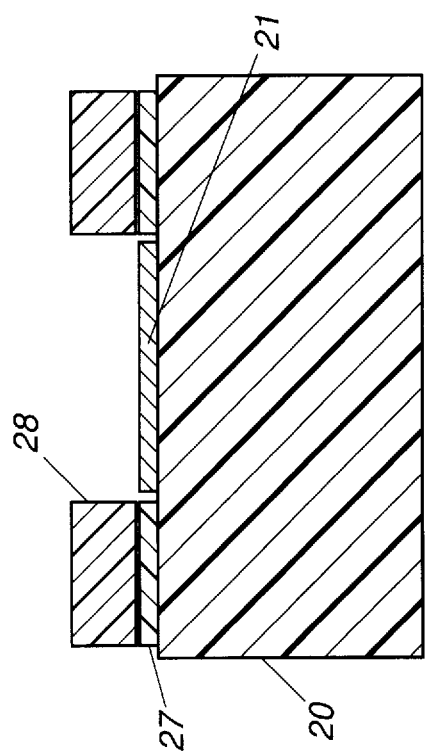
FIG. 6 shows a prior art Optipad™ cladded PCB structure after a cladding process.

FIG. 6 shows the prior art Optipad™ cladded PCB structure of FIG. 5 after the cladding process. The cladded Optipad™ structure includes a PCB 20, a permanent solder mask 27, a copper pad 21 and a flat solid solder deposit (SSD) 28.

In operation, the Optipad™ cladding process consists of selective application of molten solder followed by a flattening of the molten solder and cooling of the PCB 20. The temporary solder mask 28, of FIG. 5, is then removed resulting in a flat SSD 30.

Figure 7:
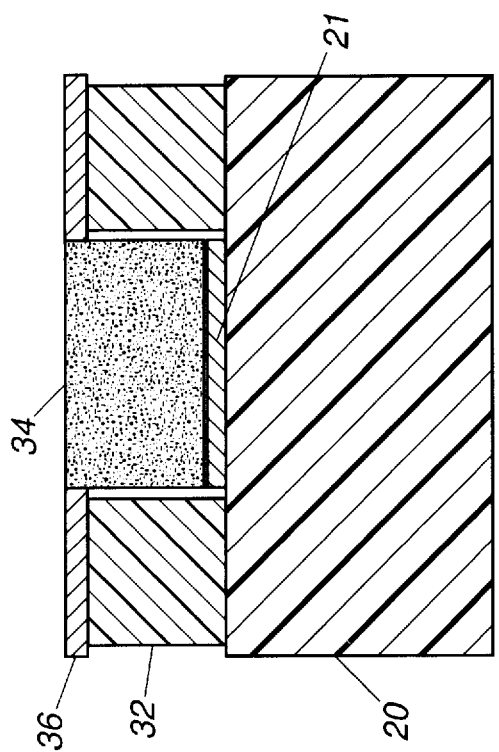
FIG. 7 shows a prior art Sipad™ (Registered Trade Mark of AG, Germany) cladded PCB structure before a cladding process.

Referring now to FIG. 7, a prior art Sipad™ cladded PCB structure before a cladding process is shown. The Sipad™ cladded PCB structure includes a PCB 20, a permanent solder mask 32, a copper pad 21, and stencils 36 enveloping a solder paste 34.

Figure 8:
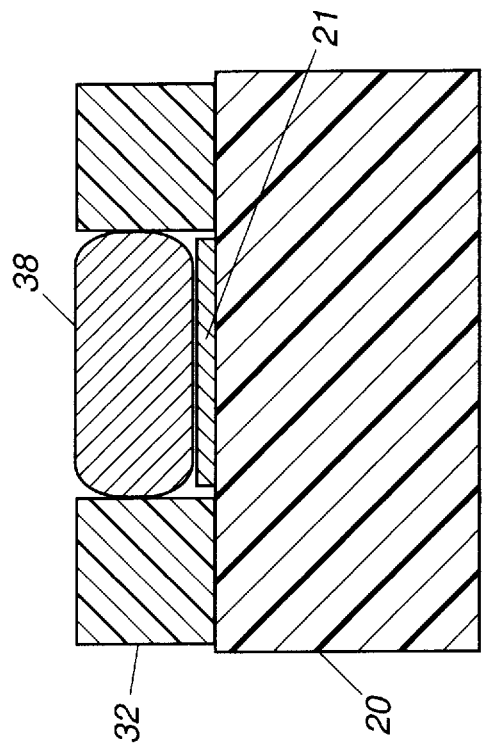
FIG. 8 shows a prior art Sipad™ cladded PCB structure after a reflow process.

FIG. 8 shows the prior art Sipad™ cladded PCB structure of FIG. 7 after the cladding process. The Sipad™ cladded PCB structure includes a PCB 20, a permanent solder mask 32, a copper pad 21, and stencils 36 enveloping a flat solid solder deposit (SSD) 38.

In operation, the Sipad™ cladding consists of passing the PCB 20 through a reflow oven followed by a second reflow operation and flattening the SSD 38 by applying pressure with a hot metal plate resulting in a flat SSD 30.

Figure 9:
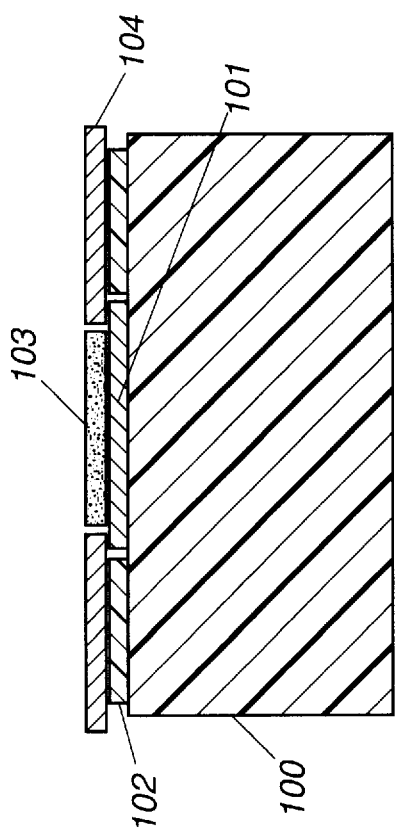
FIG. 9 shows a cladded PCB structure before a cladding process, in accordance with a preferred embodiment of the invention.

Referring now to FIG. 9, a cladded PCB structure prior to a cladding process is shown, in accordance with a preferred embodiment of the invention. The cladded PCB structure includes a PCB 100, a solder mask 102, a copper pad 101, and stencils 104 enveloping a solder paste 103 containing flux.

Figure 10:
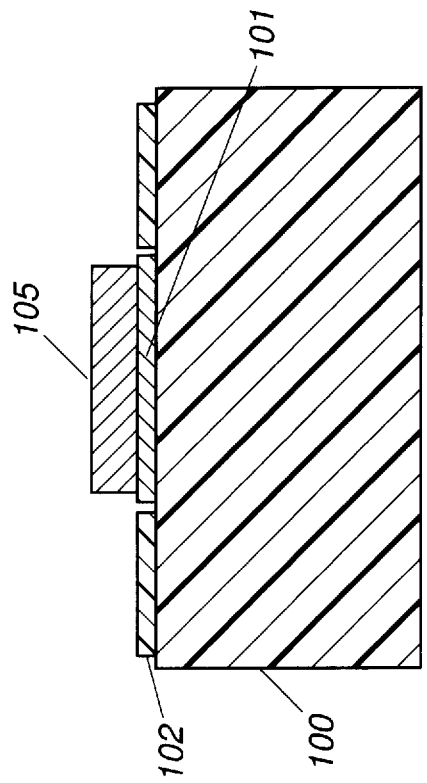
FIG. 10 shows a cladded PCB structure after a reflow process, in accordance with a preferred embodiment of the invention.

FIG. 10 shows the cladded PCB structure of FIG. 9 after the reflow process, in accordance with a preferred embodiment of the invention. The cladded PCB structure after the reflow process includes a PCB 100, a solder mask 102, a copper pad 101 and a flat solid solder deposit (SSD) 105.

In operation, the cladding process of the PCB, in accordance with a preferred embodiment of the invention, consists of applying stencils 104 to a solder mask 102 and the flux solder paste 103 to the copper pad 101. The flux solder paste 103 is dried at a temperature within a certain period of time to provide the flat SSD 105.

Figure 11:
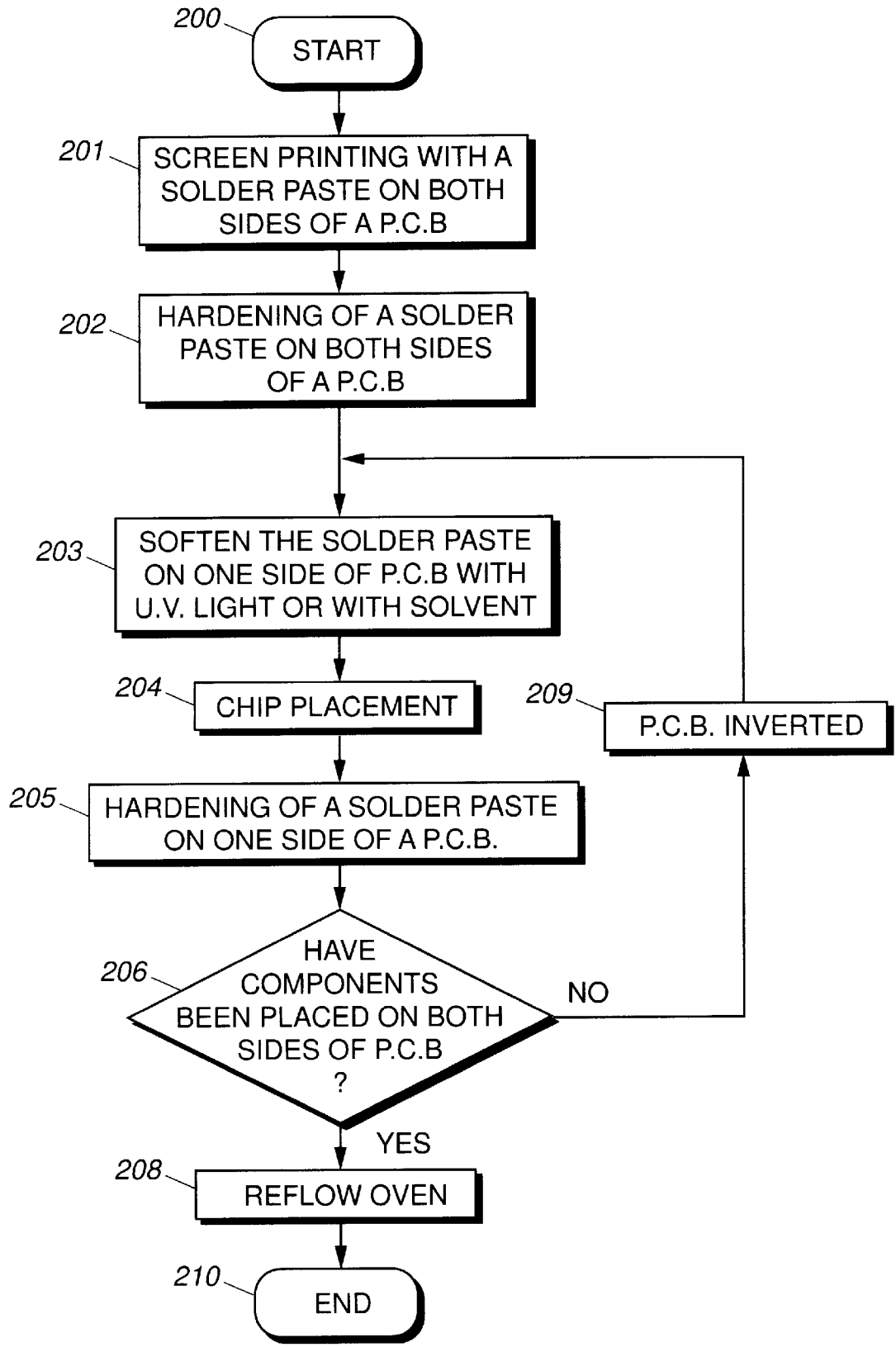
FIG. 11 is a flow chart detailing a method for a reflow soldering process of a cladded PCB, in accordance with a preferred embodiment of the invention.

Referring now to FIG. 11, a flow chart detailing a method of cladding and reflow soldering process of cladded PCB, in accordance with a preferred embodiment of the invention is shown. The method for soldering components to opposite sides of a receptive element, e.g. a PCB, includes the steps of applying a solder formulation, e.g. solder paste Kester 247B, to both sides of the receptive element and placing components on a first side of the receptive element. The solder formulation on the first side of the receptive element is hardened and the receptive element inverted. Components are placed on a second side of the receptive element and the solder formulation on the second side of the receptive element is hardened.

Preferably the step of applying a solder formulation to both sides of the receptive element includes hardening the solder formulation on both sides of the receptive element followed by softening the solder formulation on the first side of the receptive element. Preferably the step of placing components on the second side of the receptive element is preceded by softening the solder formulation on a second side of the receptive element.

Advantageously, components are then fixed onto the receptive element by placing the receptive element in a reflow oven and performing a single reflow operation.

The method describing a reflow soldering process of a cladded PCB begins in step 200 of FIG. 11. A solder paste containing a flux is screen printed on both sides of a PCB, as shown in step 201. The solder paste on both sides of the PCB is hardened, as in step 202, by drying the printed solder paste in a reflow oven at a temperature below an activation temperature of the fluxing composition. The cladding process can be performed by the PCB manufacture or in the assembly plant as part of the reflow process. The solder paste is softened on one side of the PCB with ultraviolet (UV) light or by applying a solvent or by any other method as shown in step 203. Components (chips) are placed, as in step 204, and the solder paste on one side of the PCB is hardened, as shown in step 205. If the components have not been placed on both sides of the PCB then the PCB is inverted, as shown in step 209 and the steps 203 to 205 repeated. When there are components on both side of the PCB, as in step 206, soldering of both sides of PCB in a reflow oven is performed, as shown in step 208 and the process ends, as in step 210.

Preferably the fluxing composition of the solder paste releases a reducing agent upon exposure to ultraviolet light and includes an ultraviolet sensitizer. The solder formulation is preferably softened by transmitting ultraviolet light onto the receptive element or by applying a solvent to the receptive element or by any other method.

Advantageously, the described method provides flat SSD by a simple process consisting of two stages and one reflow operation as compared to six stages of Optipad™ or four stages of Sipad™ processes with two reflow operations. The reflow process, in accordance with a preferred embodiment of the invention, is short and simple.

Thus, there is provided an improved soldering process that prevents the meniscus formation of the solder paste during reflow operations, in particular with regard to the cladding of double sided PCBs.

We claim:

1. A method for soldering components to opposite sides of a receptive element, the method comprising the steps:

applying a solder formulation to both sides of the receptive element;

hardening the solder formulation on both sides of the receptive element;

softening the solder formulation on a first side of the receptive element;

placing components on the first side of the receptive element;

hardening the solder formulation on the first side of the receptive element;

inverting the receptive element;

softening the solder formulation on a second side of the receptive element;

placing components on a second side of the receptive element;

hardening the solder formulation on the second side of the receptive element; and soldering both sides of the receptive element.

2. The method of claim 1, wherein the hardening process includes drying the receptive element at a temperature below an activation temperature of a fluxing composition.

3. The method of claim 1, further comprising the step of fixing the components onto the receptive element by placing the receptive element in a reflow oven and applying a single reflow operation.

4. The method of claim 1, further comprising the step of fixing the components onto the receptive element by placing the receptive element in a reflow oven and applying a single reflow operation.

5. The method of claim 1, wherein softening the solder formulation is performed by transmitting ultraviolet light onto the receptive element.

6. The method of claim 1, wherein softening the solder formulation is performed by applying a solvent to the receptive element.

7. The method of claim 1, wherein the receptive element is a printed circuit board.

8. The method of claim 1, wherein the step of applying a solder formulation to both sides of the receptive element is a cladding process and wherein the cladding process includes applying a fluxing composition to the solder formulation on both sides of the receptive element.

9. The method of claim 8, wherein the fluxing composition releases a reducing agent upon exposure to ultraviolet light and the fluxing composition comprises an ultraviolet sensitizer.

10. The method of claim 1, wherein the step of applying a solder formulation to both sides of the receptive element is a cladding process and wherein the cladding process includes applying a fluxing composition to the solder formulation on both sides of the receptive element.

11. The method of claim 10, wherein the fluxing composition releases a reducing agent upon exposure to ultraviolet light and the fluxing composition comprises an ultraviolet sensitizer.

12. The method of claim 10, further comprising the step of fixing the components onto the receptive element by placing the receptive element in a reflow oven and applying a single reflow operation.

* * * * *